US008928505B1

(12) United States Patent
Coenen et al.

(10) Patent No.: US 8,928,505 B1
(45) Date of Patent: Jan. 6, 2015

(54) METHOD OF FORMING AN AUDIO PROCESSING SYSTEM AND STRUCTURE THEREFOR

(71) Applicants: Ivo Leonardus Coenen, Coffrane (CH); Paulo Jorge Duarte de Jesus, Neuchatel (CH)

(72) Inventors: Ivo Leonardus Coenen, Coffrane (CH); Paulo Jorge Duarte de Jesus, Neuchatel (CH)

(73) Assignee: Semiconductor Components Industries, LLC, Phoenix, AZ (US)

( * ) Notice: Subject to any disclaimer, the term of this patent is extended or adjusted under 35 U.S.C. 154(b) by 17 days.

(21) Appl. No.: 14/018,183

(22) Filed: Sep. 4, 2013

Related U.S. Application Data

(60) Provisional application No. 61/777,982, filed on Mar. 12, 2013.

(51) Int. Cl.
  *H03M 1/00* (2006.01)
  *G06F 1/08* (2006.01)
  *H03M 1/12* (2006.01)
  *G06F 3/16* (2006.01)

(52) U.S. Cl.
  CPC ............ *H03M 1/001* (2013.01); *H03M 1/124* (2013.01); *G06F 1/08* (2013.01); *G06F 3/16* (2013.01)
  USPC .............. 341/110; 327/291; 713/500; 700/94

(58) Field of Classification Search
  None
  See application file for complete search history.

(56) References Cited

U.S. PATENT DOCUMENTS

| | | | |
|---|---|---|---|
| 5,436,628 A * | 7/1995 | Liepold | 341/110 |
| 6,516,073 B1 * | 2/2003 | Schulz et al. | 381/312 |
| 7,151,838 B2 | 12/2006 | Galler et al. | |
| 7,315,626 B2 | 1/2008 | Pedersen | |
| 7,391,347 B2 * | 6/2008 | May et al. | 341/117 |
| 7,620,194 B2 | 11/2009 | Sayler et al. | |
| 8,723,576 B2 * | 5/2014 | Matsushita | 327/291 |
| 2010/0182062 A1 * | 7/2010 | Kamath et al. | 327/162 |
| 2013/0101006 A1 * | 4/2013 | Mombers et al. | 375/226 |
| 2014/0307842 A1 * | 10/2014 | Green | 375/376 |

OTHER PUBLICATIONS

"An 80-MHz 8-bit CMOS D/A Converter", Takahiro Miki et al, IEEE Journal of Solid-State Circuits, vol. sc-21, No. 6, Dec. 1986, pp. 983-984.
"A 400-mV 50-380 MHz CMOS Programmable Clock Recovery Circuit", Patrik Larsson et al, IEEE 1995 0-7803-2707-1/95, pp. 271-274.
"Level Converters with High Immunity to Power-Supply Bouncing for High-Speed Sub-1-V LSIs", Yasuke Kanno et al., 2000 Symposium on VLSI Circuits Digest of Technical Papers, IEEE 2000 0-7803-6309-4/00, pp. 202, 203.
"A Multiply-by-3 Coupled-Ring oscillator for Low-Power Frequency Synthesis", Shwetabh Verma et al, 2003 Symposium on VLSI Circuits Digest of Technical Papers, 4-89114-034-8, pp. 189-192.
"A Multiply-by-3 Coupled-Ring oscillator for Low-Power Frequency Synthesis", Shwetabh Verma et al, IEEE Journal of Solid-State Circuits, vol. 39 No. 4, Apr. 2004, 0018-9200/04 copyright 2004 IEEE, pp. 709-713.

(Continued)

*Primary Examiner* — Howard Williams
(74) *Attorney, Agent, or Firm* — Robert F. Hightower

(57) ABSTRACT

In one embodiment, an audio processing system includes a frequency control block that forms a system clock and a master audio clock. The frequency control block is configured to change a frequency of the system clock and change a relationship between the system clock and the master audio clock so that the frequency of the master audio clock remains substantially constant.

20 Claims, 10 Drawing Sheets

(56) References Cited

OTHER PUBLICATIONS

"Output Impedance Requirements for DACs", S. Luschas et al., copyright 2003 IEEE, 0-7803-7761-3/03, pp. i-861-i-864.

Analog Devices, MT-014 Tutorial, "basic DAC Architectures I: String DACs and Thermometer (Fully Decoded) DACs", Walt Kester, rev. A, Oct. 20008, WK, 6 pps.

* cited by examiner

US 8,928,505 B1

METHOD OF FORMING AN AUDIO PROCESSING SYSTEM AND STRUCTURE THEREFOR

The present application claims priority to U.S. provisional patent application No. 61/777,982 filed on Mar. 12, 2013 entitled METHOD OF FORMING AN AUDIO PROCESSING SYSTEM AND STRUCTURE THEREFOR and having common inventors and which is hereby incorporated herein by reference.

The present application is related to U.S. patent application Ser. No. 13/451,267 entitled Method and System For Improving Quality Of Audio Sound, having Dustin Griesdorf as an inventor, and a common assignee, and which is hereby incorporated herein by reference.

BACKGROUND OF THE INVENTION

The present invention relates, in general, to electronics, and more particularly, to semiconductors, structures thereof, and methods of forming semiconductor devices.

In the past, the electronics industry utilized various methods and structures to produce audio processing systems for many various types of applications. In some applications, such as portable systems, it was important to conserve power to provide long operational time from a battery or other portable power source. For example, it was important to conserve power in applications such as for a hearing aid or for portable digital microphones, etc.

One method to assist in conserving power was to reduce a frequency of a clock that was used to control the operation of some of the elements of the audio processing system. This dynamic changing of the clock frequency was often referred to a clock throttling or clock scaling. Dynamically changing the clock speed, or clock throttling, often resulted in inconsistencies in the period of some or all of the signals derived from the clock. These inconsistencies could result in undesirable audio artifacts or glitches in incoming and/or outgoing audio signals, sometimes called pops or clicks when it affected an outgoing audio signal.

Accordingly, it is desirable to have a method of forming an audio processing system that can change the frequency of the clock and that reduces audio artifacts, and reduces audio clock period disturbances or inconstancies.

Figure 1:
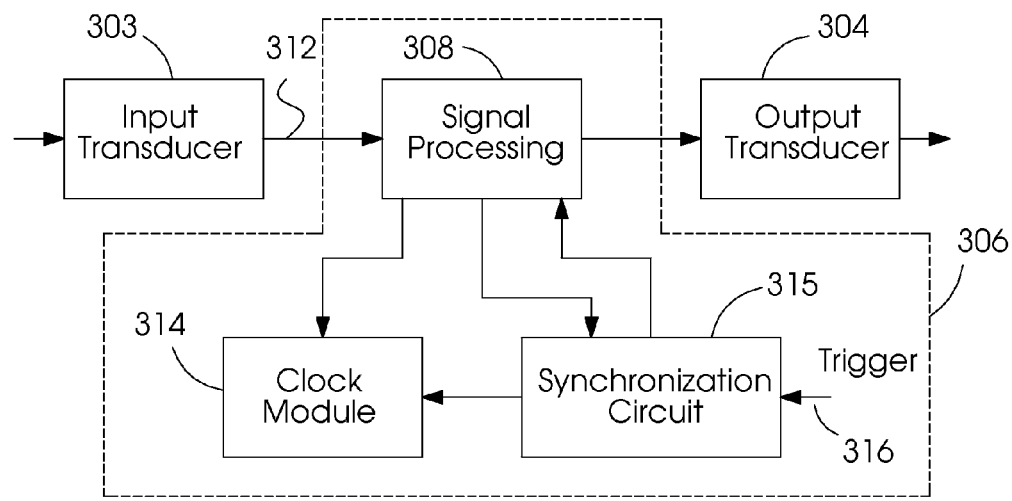
FIG. 1 schematically illustrates a portion of an example of an embodiment of an audio processing device in accordance with the present invention.

For simplicity and clarity of the illustration(s), elements in the figures are not necessarily to scale, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type of N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

DETAILED DESCRIPTION OF THE DRAWINGS

FIG. 1 schematically illustrates a portion of an example of an embodiment of an audio processing device 300 that has improved efficiency and minimizes clock period inconsistencies when preforming clock throttling. Device 300 receives audio waves (such as rarefactions and compressions of the air), translates the audio waves to electrical signals, and processes the electrical signals. Device 300 may be used in a variety of applications that receive audio waves and process them into electrical signals such as applications of a hearing aid, a microphone, a portable digital microphone that sends electrical signals wirelessly to a receiver, a cellular phone, and a variety of other applications. Device 300 typically includes an input transducer 303 and an audio processing system 306. In most embodiments, device 300 also includes an output transducer 304. Audio processing system 306 usually includes a signal processing element 308 and a frequency control block. In one embodiment, the frequency control block includes a clock module 314 and a synchronization circuit 315. Transducer 303 may be a microphone or an array of microphones or any other device that receives audio waves and converts them to electrical signals such as a hearing aid or any of the other previously mentioned applications. In one example embodiment, system 306 receives electrical signals 312 that are representative of the audio wave from transducer 303. Transducer 304 may be an earpiece such as a hearing aid earpiece, a speaker, or other device that is responsive to electrical signals. In some applications, either one or both of transducers 303 and 304 may be omitted. Signal processing element 308 typically receives processes the electrical signals according to an algorithm such as a hardware algorithm, a software algorithm, or a combination of both. For example, element 308 may include an analog-to-digital converter and a microprocessor that may process the electrical signals to reduce noise, improve signal-to-noise ratio, or add gain, or otherwise improve the quality of the signal after it has been processed. In some embodiments, element 308 may also include a digital-to-analog (D/A) converter that converts the processed electrical signals into an analog signal, for example an analog signal to drive transducer 304. Such converter may be omitted in other embodiments. In other embodiments, element 308 may include a digital signal processor (DSP).

The frequency control block is configured to generate clock signals that are used to control the operation of audio processing system 306. The frequency control block typically forms a system clock (SC) that is received by element 308 and used to control the operational speed of element 308. In some embodiments, the frequency control block also generates a second clock that may be used by portions of element 308 or other portions of system 306 to control the operational speed thereof. In other embodiments, the frequency control block may optionally generate a third clock that may be used by other portions of device 300, such as other processing logic or an optional output system (not shown). In some non-limiting embodiments, the frequency of the second clock is a fractional value of the frequency of the system clock or may be a multiple of the system clock in other embodiments. As used herein, fractional value means a fraction where the denominator is a specified value.

In some applications the frequency control block may change the frequency of the system clock in response to events such as device 300 changing an operational state such as transitioning from processing signals to an idle state or from a state that uses a less processing power to a state that uses more processing power. In one example embodiment, the frequency control block is configured to keep the frequency of the second clock substantially constant even if the system clock frequency is changed. In another non-limiting example embodiment, the relationship between the second clock and the system clock is changed in order to keep the frequency of the second clock substantially constant when the frequency of the system clock is changed. The change in the frequency of the system clock typically is initiated by a trigger signal or trigger 316 which may be initiated by a portion of element 308 or some other portion of device 300. As will be seen further hereinafter, the frequency control block is configured to minimize inconsistencies in the periods and relationships of the periods of the system clock and the second clock during the change of the frequency of the system clock thereby reducing artifacts or glitches in the outgoing signals, such as the signal sent to transducer 304. In another non-limiting embodiment, the change of the frequency of the system clock and the change in the relationship between the system clock and the second clock is synchronized to an edge of the system clock which further assists in minimizing inconsistencies in the periods and relationships of the periods of the system clock and the second clock.

Figure 2:
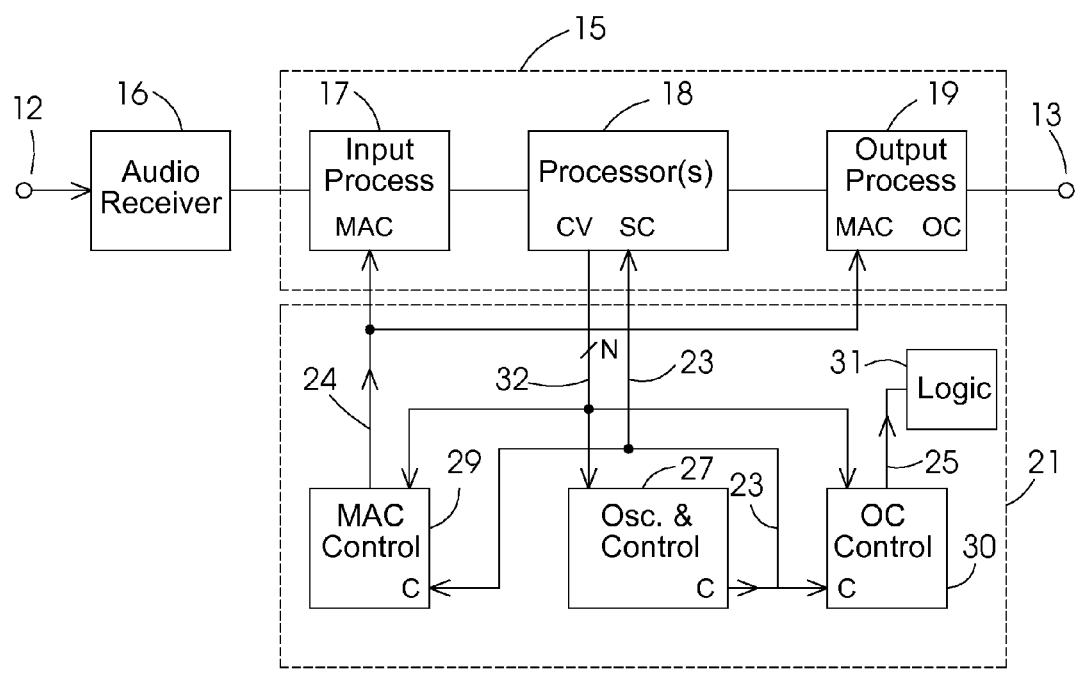
FIG. 2 schematically illustrates a portion of an example of an embodiment of another audio processing system that is an alternate embodiment of the audio processing system of FIG. 1 in accordance with the present invention.

FIG. 2 schematically illustrates a portion of an example of an embodiment of an audio processing system 10 that is an alternate embodiment of system 306 that is described in the description of FIG. 1. In some embodiments, system 10 may include a signal input 12 that receives electrical signals, for example signals from transducer 303. An optional audio receiver 16 may be used to adjust the level of the signals from input 12 and form an analog audio signal that is representative of the audio waves received by transducer 303. A signal processing element 15 of system 10 is similar to element 308 (FIG. 1). Element 15 may include various elements or blocks that assist in processing the electrical signals to improve the audio characteristics. For example, in one non-limiting embodiment element 15 may be configured to include an input processor 17 that may be used to convert the input signal to a digital signal and separate the input signal into various frequency bands, may include a main processor 18 that may be utilized to process signals from each band according to various algorithms to improve the quality of the information within each of the bands, and/or may include an output processor 19 that may recombine the outputs from processor 18 back into a single signal to produce an output signal 13 that represents the audio signal processed by the algorithms of element 15. For example, processor 17 may include an analog-to-digital (A/D) converter or may also include various filter banks, processor 18 may be configured as a logic block or a digital signal processor or some other type of computer processor that operates on the information received from processor 17, and processor 19 may include a digital-to-analog (D/A) converter or may also include various control logic to operate the D/A converter and combine the output of the converters into a single signal. In other embodiments, processors 17, 18, and 19 may all be portions of a DSP. In other embodiments one or more of processors 17-19 or portions thereof may be omitted.

A frequency control block 21 of system 10 is similar to the frequency control block explained in the description of FIG. 1. In one embodiment, block 21 may include an oscillator and control block 27 that forms a system clock (SC) 23 that is similar to the system clock described in the description of FIG. 1. SC 23 may be used by element 15 to control the operational frequency of element 15. In most embodiments, block 21 also includes a master audio clock (MAC) control block or MAC control 29 that is configured to form a second clock or master audio clock (MAC) 24 that is synchronized to system clock (SC) 23 and has a frequency that is related to the frequency of SC 23 such as related as a fractional value of the frequency of SC 23. In other embodiments, MAC 24 may be a multiple of SC 23. In some embodiments, block 21 may also include an optional other clock (OC) control block or OC control 30 that is configured to form an optional third clock or other clock (OC) 25 that is related to the system clock and has a frequency that is related to the frequency of SC 23 by the same value or different value as the frequency of MAC 24 is related to the frequency of SC 23. In most embodiments, MAC 24 is configured to control the operation frequency of the circuit elements or conversion circuits that convert the analog signals to digital and from digital to analog. In embodiments that include OC 25, OC 25 may be used to control the operational frequency of other support logic and functions, such as logic 31. In other embodiments, the conversion circuits (or circuit elements, for example digital-to-analog converter(s) or analog-to-digital converter(s)) can also be operated by OC 25, which may have a higher frequency of MAC 24, while still being a fractional value of the frequency of SC 23. In such an embodiment the frequency of OC 25 is often a multiple integer of the frequency of MAC 24. In other embodiments, it may be the other way around in that the circuits that convert analog to digital may be operated by OC 25, while the circuits that convert digital to analog may be operated by MAC 24. In another embodiment, OC 25 may also be used by other slower speed logic of processors 17 and/or 18.

In some operational conditions, it may be advantageous to increase the speed of system clock 23 that goes to the computer processor, for example processor 18, in order for the computer processor to run algorithms at increased speed to process the electrical signals. However, it typically is not advantageous to change the speed of the clocks used to operate elements of processors 17 and 19. For example, clocks that are used to control the operational speed of A/D and D/A converters usually are not changed because they are operate best at one specific speed and it is often desired that the sampling rate stays constant. Therefore, block 21 is configured to change the frequency of SC 23 while maintaining the frequency of MAC 24 (and optional OC 25) substantially constant and while minimizing variations or fluctuations of the periods of MAC 24 and SC 23. In some non-limiting embodiments, the change in the frequency of SC 23 and changes in the relationship between the frequency of SC 23 and MAC 24 are synchronized to an edge of SC 23. In other non-limiting embodiments, the change in the frequency of SC 23 and changes needed to maintain MAC 24 substantially constant are synchronized to a change in the state of SC 23.

Figure 3:
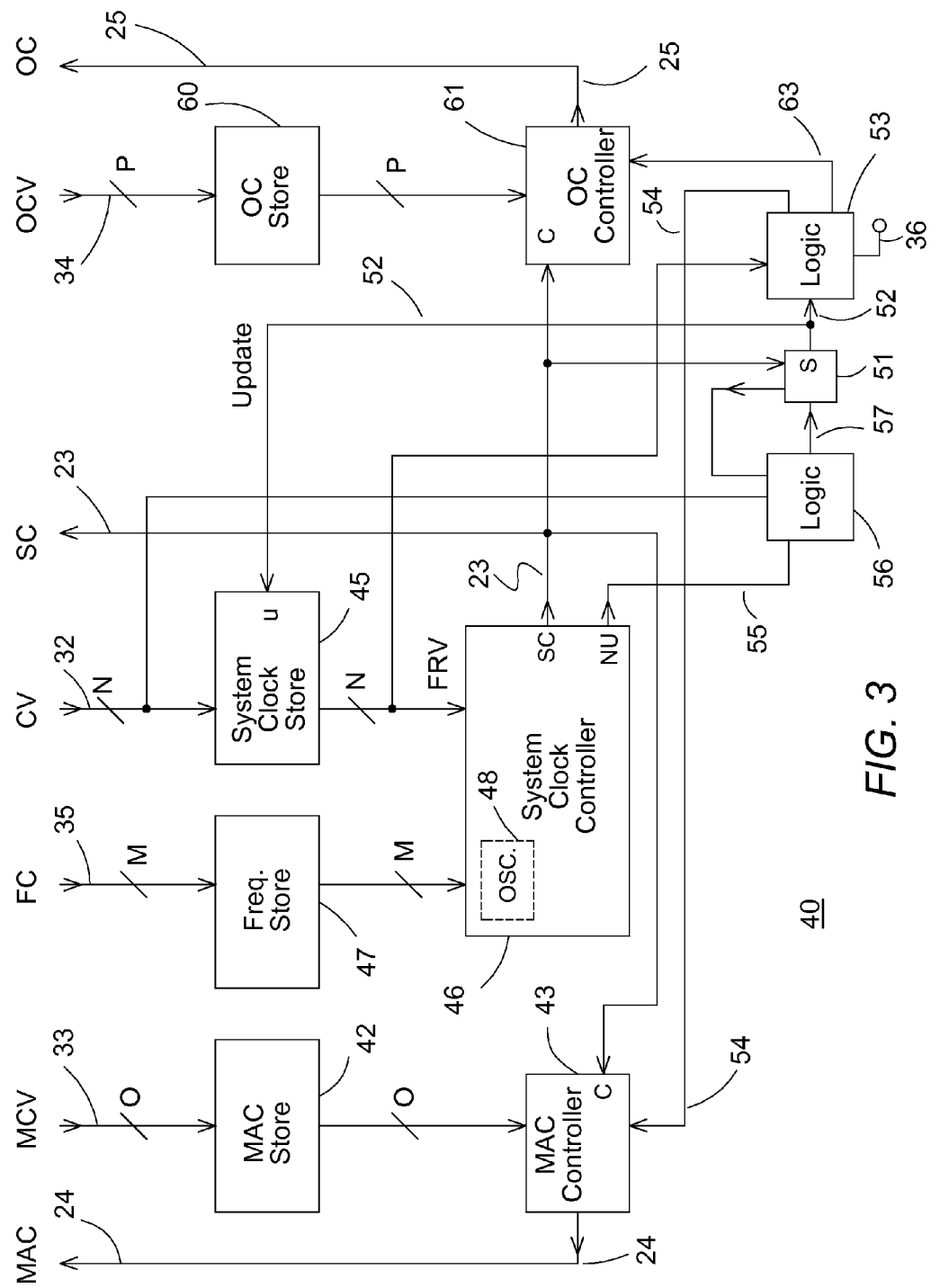
FIG. 3 schematically illustrates a portion of an example of an embodiment of a frequency control block that is an alternate embodiment of a frequency control block of FIG. 2 in accordance with the present invention.

FIG. 3 schematically illustrates a portion of an example of an embodiment of a frequency control block 40 that is an alternate embodiment of control block 21 described in the description of FIG. 2 and of the frequency control block of FIG. 1. Block 40 includes a system clock controller 46 that has a master oscillator or oscillator 48 from which SC 23 and MAC 24 may be derived. For the example embodiment illustrated in FIG. 3, oscillator 48 is a variable frequency oscillator that forms a plurality of digital clock signals that are used by controller 46 to form SC 23. For example, oscillator 48 may receive an analog signal where the frequency of oscillator 48 varies proportionally to variations in the analog signal. In one embodiment oscillator 48 may be a digital oscillator that receives a digital word to set the frequency of oscillator 48. In one example embodiment, oscillator 48 may be a ring oscillator that has multiple outputs that allow rapidly changing the frequency of the clock signal used to form SC 23. In other embodiments, oscillator 48 may not have a variable frequency. Some embodiments include a frequency storage element or frequency storage or frequency store 47 that may be configured to store a digital word having a value that is representative of the frequency at which oscillator 48 is operating or a frequency to which oscillator 48 is to change. In some embodiments, store 47 may also include other elements to convert the digital word to an analog value. Store 47 typically receives the digital word from element 15, such as from processor 18, on a frequency control (FC) input 35. In some embodiments, store 47 may be a portion of oscillator 48.

Controller 46 is configured to receive the clock signal(s) from oscillator 48 and form SC 23 to have a frequency that is related to a base frequency of oscillator 48 or base frequency. For example, controller 46 along with oscillator 48 may be configured as a frequency multiplier that selectively multiplies the base frequency to form SC 23 with a higher frequency than the base frequency. In some embodiments, the multiplier value may be unity. In some example embodiments, controller 46 may be configured as a divider that selectively divides the base frequency to form SC 23 with a lower frequency than the base frequency, or may include a multiplier and/or a divider. Block 40 generally includes a system clock storage element or system clock storage or system clock store 45 that may be configured to store a value that is representative of the relationship between the frequency of SC 23 to the base frequency. The relationship between the base frequency and the frequency of SC 23 is formed as a first relational value. For example, if controller 46 is a multiplier, store 45 stores the value by which the base frequency is multiplied (or value that the base frequency will be multiplied by) in order to form the frequency of SC 23. Store 45 typically receives the value as a digital word from element 15 on a clock value (CV) input 32. In other embodiments the first relational value may be an analog value. In some example embodiments, store 45 may be a portion of controller 46.

A master audio clock controller or MAC controller 43 may be configured to receive SC 23 and form MAC 24 with a frequency that is related to the frequency of SC 23. For example, controller 43 may be configured as a divider that selectively divides the frequency of SC 23 to form MAC 24 with a lower frequency than the frequency of SC 23. In some non-limiting embodiments, controller 43 may include a multiplier and/or a divider to form MAC 24 from SC 23. In other embodiments, controller 46 may receive the base frequency and multiply the base frequency by a second value to form MAC 24. A MAC storage element or MAC storage or MAC store 42 may be configured to store a value that is representative of the relationship between the frequency of MAC 24 and the frequency of SC 23. The relationship between the frequency of SC 23 and MAC 24 is formed as a second relational value. For example if controller 43 functions as a divider, the second relational value represents a value by which the frequency of SC 23 is divided (or will be divided) in order to form the frequency of MAC 24. Store 42 typically receives the value as a digital word from element 15 on a MAC value (MCV) input 33. In other embodiments the second relational value may be an analog value. In some embodiments, store 42 may be a portion of controller 43.

In one embodiment, block 40 is configured to form a change in the frequency of SC 23 and a change in the relationship between SC 23 and MAC 24 so that the change is synchronized to SC 23. As will be seen further hereinafter, in some embodiments block 40 is configured to change the frequency of SC 23 by a first amount and to also change the relationship between MAC 24 and SC 23 by the first amount so that the frequency of MAC 24 remains substantially constant. In one embodiment block 40 is configured to either increase of decrease SC 23 by the first amount and to change the relationship between MAC 24 and SC 23 opposite to the change in SC 23, such as increase SC 23 by an amount and decrease the second relational value by that amount, or vice versa.

In some embodiments, frequency control block 40 may include elements for optionally forming a third clock signal or other clock (OC) or OC 25 that is also derived from SC 23. OC 25 may be used for controlling the operational speed of other logic elements of element 15. OC 25 typically would have a lower frequency than SC 23 but may also be lower than MAC 24 in other embodiments. In one embodiment, block 40 includes an OC controller 61 that is configured to receive SC 23 and form the frequency of OC 25 as a fractional value of the frequency of SC 23. The fractional value may be different from the fractional value used to form MAC 24 or may be the same. In other embodiments, controller 61 may include a divider to form OC 25 from SC 23. An OC storage element or OC storage or OC store 60 may be configured to store a value that is representative of the value by which the frequency of SC 23 is divided (or will be divided) in order to form the frequency for OC 25. Store 60 typically receives the value as a digital word from element 15 on an OC value (OCV) input 34. In other embodiments the value may be an analog value. Storage 60 may optionally be a portion of controller 61. Those skilled in the art will understand that the MCV, FC, CV, and OCV signals each may be digital signals that may include a number of individual signal lines. For example, any of the signals may form a digital word and may include a number of different digital signal lines to make form the digital word. These multiple number of signals is illustrated in a general manner by the corresponding letters O, M, N, and P.

Figure 4:
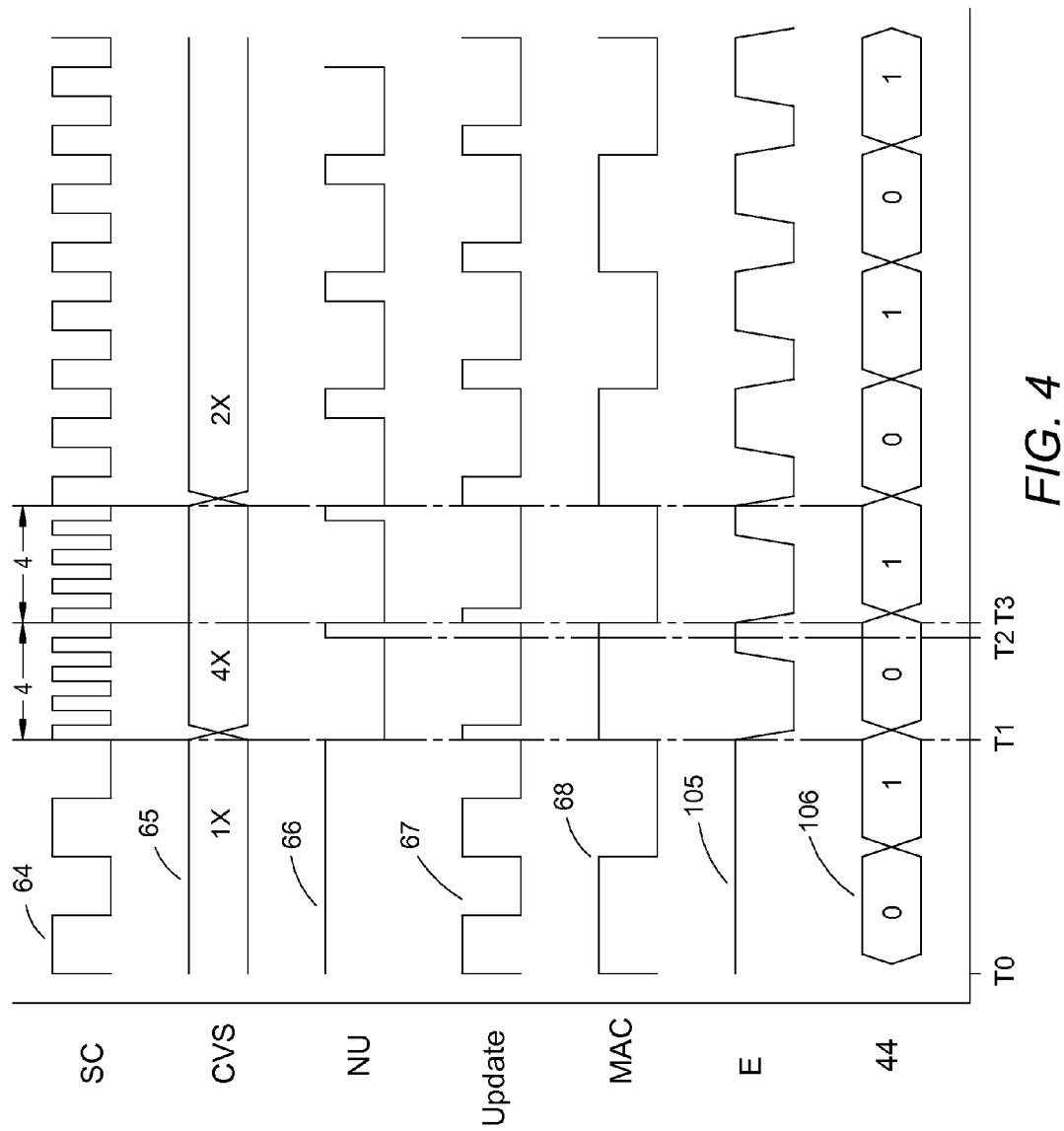
FIG. 4 is a graph having plots that illustrate some of the signals formed by the frequency control block of FIG. 3 in accordance with the present invention.

FIG. 4 is a graph having plots that illustrate some of the signals formed by block 40. The abscissa indicates time and the ordinate indicates increasing value of the illustrated signal. A plot 64 illustrates SC 23, a plot 65 illustrates the first relational value (FRV) presented to controller 46 from store 45. A plot 66 illustrates a next update signal (NU) 55, and a plot 67 illustrates an update signal 52 that will be explained further hereinafter. A plot 68 illustrates MAC 24. A plot 105 illustrates an enable signal (E) 63 that will be explained further hereinafter, and a plot 106 illustrates a count value of controller 43, for example the value of an internal counter thereof, that also will be explained further hereinafter. This description has references to FIG. 3 and FIG. 4.

In one embodiment, controller 46 is configured to form a next update state signal (NU) 55 that operates at the frequency of SC 23. Controller 46 is configured to assert NU 55 at the point where controller 46 is in a state where controller 46 can accept a change in the first relation value between SC 23 and the base frequency. In the preferred embodiment, controller 46 is configured to assert NU 55 as controller 46 is within the last period of a controller cycle. For the embodiment of controller 46 including a multiplier that multiplies the base frequency by the first relational value, the controller cycle is the number of SC 23 clock periods required to equal the first relational value. For example, if the first relational value is four (4), then it takes four (4) SC 23 clock periods to complete one controller cycle. The controller cycle may also be referred to as a multiplier cycle for the embodiment where controller 46 includes a multiplier. In one example embodiment, controller 46 may assert NU 55 at the point when the multiplier of controller 46 has reached a count of zero and in response to a change in the state of SC 23. In other embodiments, some other value may be used to signify the completion of the controller cycle. NU 55 may be used to assist in synchronizing the frequency changes of SC 23 and the change in the relationship between MAC 24 to SC 23.

In some embodiments, block 40 may also include logic blocks 53 and/or 56 and a synchronizer 51 that assist in selectively changing the frequency of SC 23 and selectively changing the relationship of MAC 24 to SC 23 and minimizing variations in the period of SC 23 and MAC 24. Block 56 is configured to receive NU 55 and the CV value from input 32 and provide a signal 57 which indicates that the value of CV 32 has changed and that controller 46 is at a point in the controller cycle where the relationship value be changed. Synchronizer 51 is configured to receive signal 57 and SC 23 and provide an update signal or update 52 to store 45 that is synchronized to the next transition of SC 23. Typically, NU 55 is generated on a different edge of SC 23 than is used as the active edge of synchronizer 51, this assists in allowing for setup and hold times for various elements of block 40 such as synchronizer 51. In one example embodiment, block 56 and synchronizer 51 are configured to assert update 52 based on the state of NU 55 only if the value of CV 32 has changed. In the preferred embodiment, update 52 is asserted in response to the rising edge of SC 23, thus, changes to the value within store 45 are synchronized to the rising edge of SC 23. However, they may be synchronized to other edges in other embodiments. Store 45 accepts the new value and provides the new value to controller 46. Logic 53 may be configured to assert an enable signal 54 to enable controller 43 to control MAC 24 at the interval specified by the second relational value. This facilitates changing the relationship between SC 23 and MAC 24. For example, logic 53 may be configured to receive an enable signal from an input 36 and use the enable signal to determine how to control controller 43 to form MAC 24 at the desired relationship to SC 23. The enable signal generally is formed by other elements in system 306 (FIG. 1). In one example embodiment, the enable signal is formed by signal processing element 308. In one example embodiment, logic 53 is configured to pass signal 52 to store 54 responsively to a first state of the enable signal (such as an asserted state for example) or to not pass signal 52 to store 54 (for a non-limiting example, hold signal 52 at a constant state) responsively to a second state (such as a negated state). In one example embodiment, signal 54 enables controller 43 to divide SC 23 as specified by the second relational value. For example, logic 53 may be configured to enable controller 43 to count or divide SC 23 once for some number of SC 23 cycles, such as once every four cycles for example. The interval may be formed by the FRV signal or a change in the RFV signal. In another embodiment, logic 53 may be configured to change the operation of enable signal 54 if CV 32 has changed and responsively to receiving the update signal from synchronizer 51. Because controller 46 changes the frequency of SC 23 according to the new value and controller 43 changes the relationship to SC 23 according to the same new value, the frequency of MAC 24 remains substantially constant as SC 23 changes. In other examples, controller 46 changes the frequency of SC 23 by a first amount, and controller 43 changes the relationship of the frequency of MAC 24 to the frequency of SC 23 by the first amount to keep the frequency of MAC 24 substantially constant for changes in the frequency of SC 23. Additionally, because the changes in the values or relationships are applied to controllers 43 and 46 substantially simultaneously and synchronized to SC 23, block 40 minimizes errors in the phase of SC 23 and MAC 24 and the periods of SC 23 and MAC 24 while dynamically adjusting the value of SC 23, thus, block 40 minimizes audio artifacts that results from changing the frequency of SC 23. In another embodiment, synchronizer 51 may receive NU 55 and synchronize update 52 to the next rising edge of SC 23 without logic block 56. In one non-limiting example embodiment, synchronizer 51 may be a D type flip-flop that receives NU 55 on the D input and receives SC 23 on the clock input. In another optional embodiment, controller 43 may be separated into several blocks with one portion of or all of the count functions in another block (not shown). In one non-limiting example of an operational flow, assume that at a time T0 (FIG. 4) oscillator 48 is running at a base frequency as specified by the value from store 47. Assume that controller 46 is configured to include a multiplier that selectively multiplies the base frequency according to the first relational value stored in store 45 which results in forming SC 23 at a first frequency. Assume that controller 43 includes a divider that selectively divides SC 23 by the second relational value to form MAC 24 at a second frequency. Also assume that the system that includes block 40 utilizes MAC 24 to control the operation of an audio converter that converts an analog signal to a digital signal and uses SC 23 as a clock to operate a computer processor, such as a CPU of a digital signal processor or a CPU of a microprocessor core or other similar CPU.

At time T0, the relational value between SC 23 and the base frequency is one (1) so that SC 23 has the same frequency as the base frequency. Because the relational value is one (1) the multiplier cycle is one (1) so that NU 55 is always asserted (plot 66). Therefore, update 52 operates at the frequency of SC 23 (plot 67).

Assume that at a time T1 the frequency of SC 23 is to be increased. For example, a processor, such as processor 18 (FIG. 2), may determine that it is advantageous to increase the frequency of SC 23 such as to provide additional processing power to process the incoming signal through the algorithms calculated by the processor. In order to change the frequency of SC 23 while maintaining the frequency of MAC 24 substantially constant, the processor may be configured to write a new first relational value to store 45 prior to T1 that will increase the frequency of SC 23 by increasing the first relational value provided to controller 46 for multiplying the base frequency. For example, the processor may write a value that is greater than the value used by controller 46 from time T0 to T1 by a factor of four (4), thus change the first relational value by a factor of four (4). The processor may also store a second relational value in store 42 prior to T1 that will change the second relational value by the same factor and cause controller 43 to divide the frequency of SC 23 so that the value of MAC 24 remains substantially constant. For example, the processor may write a value to store 42 that four (4) times the value used by controller 43 from time T0 to T1, thus increase the second relational value by a factor of four (4). Prior to time T1, the new value is presented to store 45. At time T1, update 52 is asserted on the rising edge of SC 23 and the new value is stored into store 45 and is loaded into controller 46. Logic 53 changes enable signal 54 as specified by NU 55 and CV 32 to change the relationship between SC 23 and MAC 24. As illustrated at time T1, the frequency of SC 23 increases by four but the frequency of MAC 24 remains substantially constant because the second relational value of controller 43 was increased by four (4) so that controller 43 divides SC 23 by an additional factor of four. Additionally, the period of MAC 24 remains substantially constant and the new periods of SC 23 are substantially equal so that the new periods of MAC 24 are substantially equal. Therefore, the audio devices that use MAC 24 to control the operation thereof continues to receive a clock signal that has not changed so that the audio devices do not produce audio artifacts in the outgoing signals. Additionally, the configuration of block 40 maintains the duty cycle of MAC 24 substantially constant as the frequency of SC 23 changes.

After time T1, the multiplier cycle has increased to four (4), thus, NU 55 is asserted on the negative edge of SC 23 once every four (4) cycles of SC 23, such as at a time T2. Therefore, update 52 is asserted on the next positive edge of SC 23 following NU 55 such as illustrated at time T3.

In other embodiments of an operational method, the base frequency may be changed in order to change the frequency of SC 23. For a change in the frequency of oscillator 48 which results in a change in the base frequency of SC 23 by a factor, the second relational value is also changed by the same factor that SC 23 is changed as a result to the change in the base frequency. For example, if the change in the base frequency cause SC 23 to change (increase or decrease) by a factor of three (3), then the second relational value is also changed (increased or decreased, respectively) by a factor of three so that controller 43 divides SC 23 by the additional factor of three to maintain MAC 24 substantially constant.

In another embodiment of an operational method, the base frequency and the first relational value may both be changed which results in changing the frequency of SC 23 by a first factor. The second relational value is also changed by the first factor so that the frequency of MAC 24 remains substantially constant. For example, the frequency of oscillator 48 and the first relational value may be changed which results in the decreasing the frequency of SC 23 by a factor of five (5). The second relational value is then changed by a factor of five. As another non-limiting example, assume that the frequency of SC 23 is ten (10) and that the second relational value is ten (10) so that controller 43 divides SC 23 by ten (10) so that the frequency of MAC 24 is one (1). Assume that the frequency of SC 23 is decreased by a factor of five (5) resulting in a frequency of two (2). The value of the second relational value is also decreased by a factor of five (5) so that it becomes two (2) and controller 43 divides SC 23 by two (2) so that MAC 24 remains at one (1).

In another embodiment that includes optional controller 61 and store 60, controller 61 typically may include a divider that may assist in forming OC 25. Logic 53 may control controller 61 similarly to controller 43 but using the relational value from OCV 34 instead of from MCV 33. Logic 53 may also be configured to generate another load signal 63 that enables controller 61 to divide at periodic intervals as similarly described for the operation of controller 43. In other embodiments, controller 61 may be separated into several blocks with one portion of or all of the count functions in another block (not shown).

Figure 5:
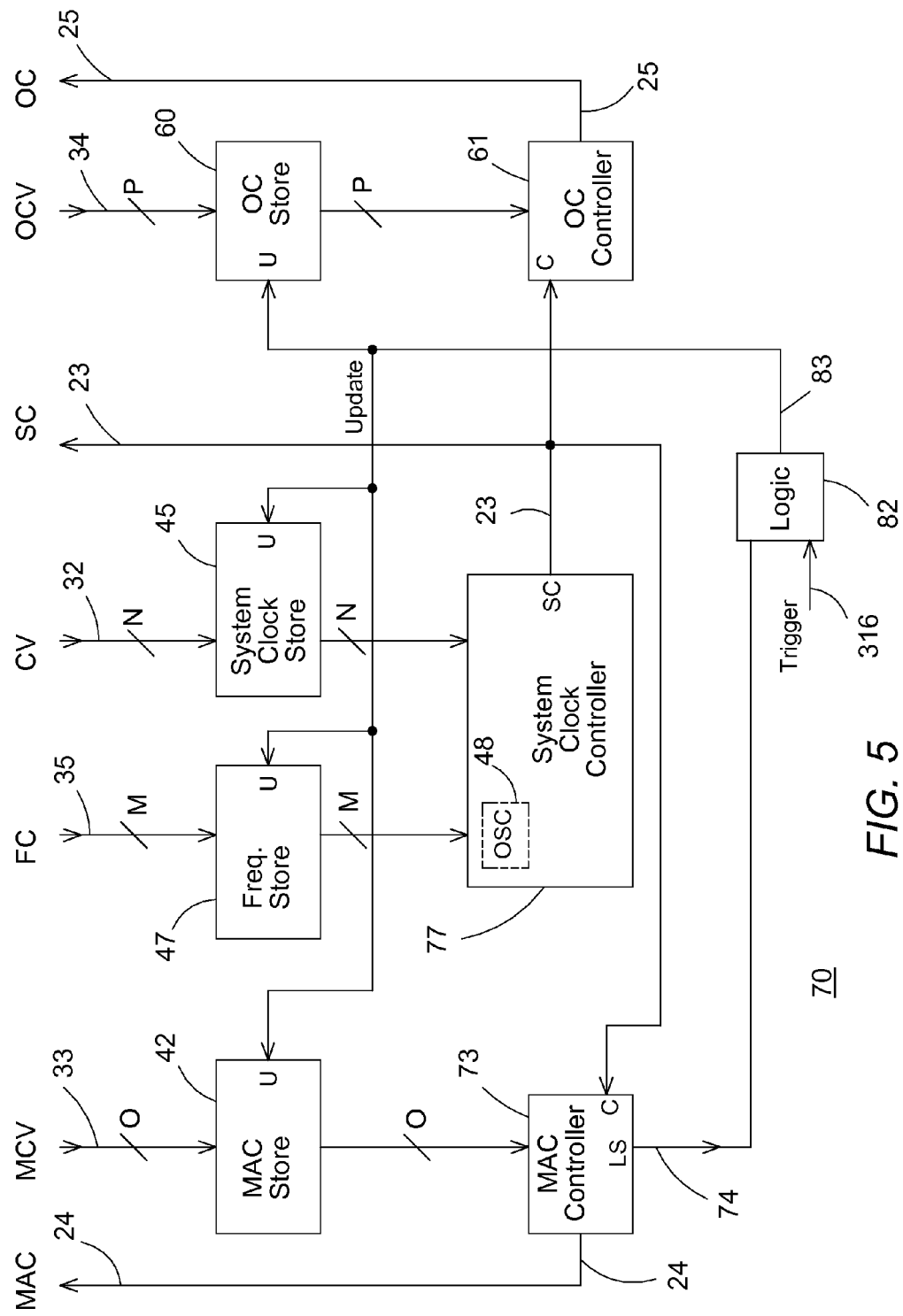
FIG. 5 schematically illustrates a portion of an embodiment of another frequency control block that is an alternate embodiment of the frequency control blocks of FIG. 2 and FIG. 3 in accordance with the present invention.

FIG. 5 schematically illustrates a portion of an embodiment of a frequency control block 70 that is an alternate embodiment of block 40 (FIG. 3) and of the frequency control block of FIG. 1. Block 70 is similar to block 40 however controllers 43 and 46 are replaced by respective controllers 73 and 77, logic 56 is replaced by logic 82, and synchronizer 51 is omitted.

Controller 73 is similar to controller 43, however, controller 73 is configured to form a load state signal or LS 74 responsively to controller 73 processing the second relational value received from store 42 to a state where controller 73 can accept a change in the second relation value between MAC 24 and SC 23. Controller 77 is similar to controller 46, however, controller 77 is not configured to form NU 55. Logic 82 is configured to form an update signal 83 responsively to receiving LS 74. Stores 42, 45, 47, and 60 are configured to store values from respective inputs 33, 32, 35, and 34 responsively to update signal 83.

In operation, stores 42, 45, 47, and 60 are all loaded with values responsively to update signal 83 from logic 82. The new values are presented to, respectively, controller 73, controller 77, oscillator 48, and controller 80. Controller 77 forms SC 23 to be an integer value of the base frequency. Controller 73 and optional controller 80 operate at the frequency of SC 23. Controller 73 forms MAC 24 to be a fractional value of SC 23.

In the preferred embodiment, controller 77 is a multiplier that multiplies the value of the base frequency by the value received from store 45 in order to form SC 23 at the frequency determined by the clock value (CV) received from input 32. In this preferred embodiment, controller 73 includes a divider that receives SC 23 and divides the frequency of SC 23 by the value received from store 42 in order to form MAC 24 as a fractional value of SC 23. In this preferred embodiment, controller 73 is configured to assert LS 74 when a counter of the divider has reached a value of zero. In other embodiments, other counter values may be used to form LS 74, for example a value of the second relational value.

Because the value used by controller 73 is programmable, the frequency of SC 23 may be increased or decreased by a factor as needed as long as the value used by controller 73 is caused to correspondingly increase or decrease by the same factor to from the frequency of MAC 24 substantially constant as the value of SC 23 changes. This configuration facilitates changing the value of SC 23 and MAC 24 substantially simultaneously thereby minimizing variations in the periods of SC 23 and MAC 24 which reduces the occurrence of artifacts in the outgoing signal from element 15. Those skilled in the art will understand that there may be some slight variation in the periods of SC 23 and MAC 24 resulting from the new values received from stores 42 and 45 because of the time required to load new values into controllers 73 and 77, however these period errors are very small.

Those skilled in the art will appreciate that storages 42, 47, 45, and 60 are all clocked by SC 23 and because storages 42, 47, 45, and 60 receive/store new values responsively to signal 52 which minimizes the period errors that may be formed in MAC 24 that is formed by block 70.

Figure 6:
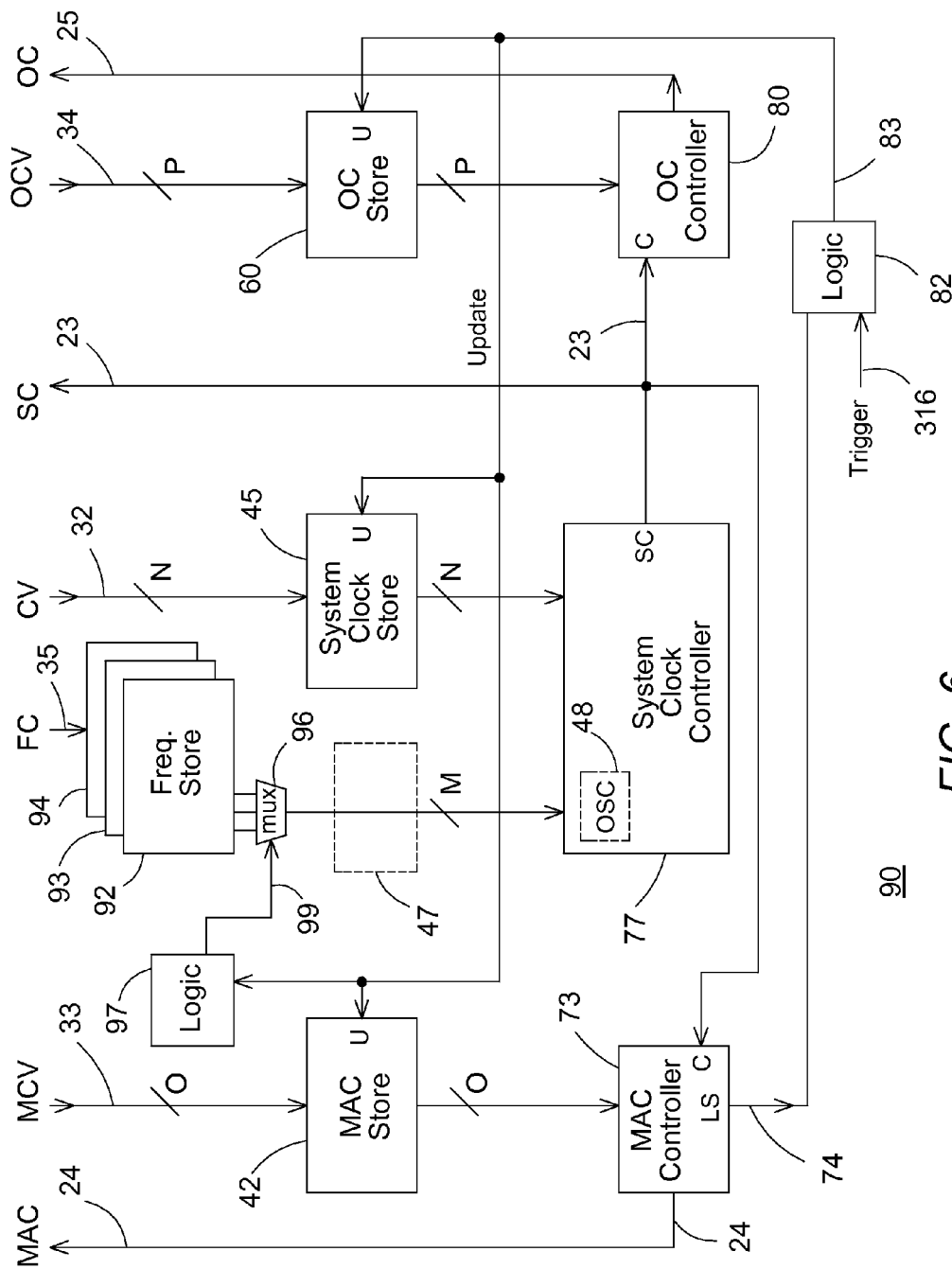
FIG. 6 schematically illustrates a portion of an example of an embodiment of another frequency control that is an alternate embodiment of the frequency control blocks of FIG. 2, FIG. 3, and FIG. 5 in accordance with the present invention.

FIG. 6 schematically illustrates a portion of an example of an embodiment of a frequency control block 90 that is an alternate embodiment of block 40 (FIG. 3), block 70 (FIG. 5), and an alternate embodiment of the frequency control block of FIG. 1. Block 90 is similar to block 70, however, store 47 is replaced by a plurality of active frequency compensation storage elements or active stores or stores 92, 93, and 94.

It has been found that in some prior configurations that varied frequencies of the oscillator, the first cycle of the system clock following the frequency change may (in some instances) be longer than it should be for the frequency set by the new value and that the second clock cycle may (in some instances) be too short. It is believed that in these prior configurations this may be because of the time required for updating the configuration registers or other delays in the loop.

Consequently, in order to further minimize errors in the periods of SC 23 and MAC 24, block 70 is configured to actively compensate the frequency of the clock signals by adjusting the frequency of oscillator 48 and the base frequency responsively to providing the new values to oscillator 48. In some embodiments, block 70 is configured to actively compensate the frequency of the clock signals by adjusting the frequency of oscillator 48 and the base frequency responsively to changes in the frequency of SC 23.

Block 90 also includes a selector circuit that is configured to select one of the values from stores 92-94 as the value supplied to oscillator 48. In one non-limiting example embodiment, the selector circuit includes a multiplexer 96 and an update logic block or logic 97. For this example embodiment, logic 97 may be configured to generate a multiplexer control signal 99 can be used by multiplexer 96 to select the output of one of stores 92-94 and send that output to oscillator 48. In another embodiment, the values are preloaded into stores 92-94 prior to changing the frequency of SC 23, and logic 97 selects one of the values to be loaded into store 47, illustrated in dashed lines. In another embodiment, store 47 is omitted and multiplexer 96 may also be configured to select the output of one of stores 92-94 and send that value to oscillator 48 to use in setting the base frequency.

Block 90 is configured to change the base frequency for some number of cycles of the base clock from oscillator 48 responsively to changing the frequency of SC 23. For example, the base frequency may be increased for a few cycles responsively to increasing the frequency of SC 23 relative to the base frequency and may be decreased for a few cycles of the base frequency responsively to decreasing the value of SC 23 relative to the base frequency. The number of cycles of the base frequency for which the base frequency is increased depends on the reaction time of block 90 to a change in the value loaded into controller 77. The reaction time usually results in a change in the period of SC 23 that is equal to the reaction time. Therefore, the base frequency may be increased for a time that is sufficient to adjust SC 23 so that the average frequency of SC 23 is the desired value. For example, the base frequency may be increased to run at a frequency that is higher than the desired frequency for one cycle then adjusted to run less than the desired frequency for one cycle of the base frequency and then adjusted to run at the desired frequency thereafter. The number of cycles that the base frequency is increased or decreased from the desired frequency and the percentage by which it is increased or decreases depends on the reaction time as described hereinbefore. In the preferred embodiment, these changes in the base change the duty cycle of SC 23 but do not change the frequency of SC 23, thus, the frequency of MAC 24 is not changed and remains substantially constant. In other embodiments, these changes in the base frequency may result in a small and temporary change in the frequency of SC 23.

In one non-limiting example configuration of block 90, the amount of change in the frequency from the desired value and the number of periods of the base frequency that the frequency is different from the desired value can be calculated.

For the first period of the new frequency, the period could have a duration of:

Period1=(OPP*OP)+(NPP*NP)

where;
OPP=RT/OP
NPP=1−(RT/OP)
RT=Reaction time,
NP=desired period of the new desired frequency,
OP=period of the previous frequency before changing the frequency.
The new period error NPERT is the time that the new period may be either too short or too long.
NPERT=OPP*(OP−NP).

For the second period of the new frequency, the period could have a duration calculated using the same equations but by changing OP to Period1. In one non-limiting example configuration, the period of the base frequency was dynamically adjusted for three periods after changing the base frequency from 5.12 MHZ to 1.28 MHz. The total reaction time of the system was 100 nsec. The first cycle of the frequency was set at approximately forty four percent (44%) lower than the target frequency of to 0.72 MHz, resulting in the desired period of 781 nsec. For the second cycle the frequency was set to approximately six and one-half percent (6.5%) higher than the target new frequency of 1.36 MHz, resulting in the desired period of 781 nsec. For the third cycle the frequency was decreased to approximately one percent (1%) lower than the target new frequency to 1.27 MHZ resulting in the desired period of 781 nsec. In the resulting fourth period, the target frequency was set which resulted in a period error of approximately one (1) nsec. The following cycles had substantially no errors.

Although the first and second relational values generally are changed when the frequency of oscillator 48 is changed to go from one desired frequency to a second desired frequency, the first and second relational values generally are not changed as the frequency of oscillator 48 is dynamically adjusted to compensate the base frequency in order to form the desired frequency and period of the base frequency. Those skilled in the art will understand that these dynamic adjustments are typically small variations of the clock period so that changes in the first and second relational values generally are not desired.

Those skilled in the art will appreciate that although three of stores 92-94 are illustrated in the FIG. 6, block 90 may use any number of stores to compensate the base frequency a variety of times in response to changing the frequency of SC 23.

In most embodiments, a main processor, such as processor 18 (FIG. 2), writes values into stores 92-94 based on the percent of change in SC 23 or MAC 24 that the new base frequency will produce. The main processor may also control the number of different values that logic 97 uses to compensate the period of the base frequency.

Additionally, it will be appreciated by those skilled in the art that instead of using stores 92-94, logic 97, and multiplexer 96, the processor may be programmed to write successive different values to store 47 so that the base frequency may be actively compensated using a software algorithm instead of using the hardware of stores 92-94, logic 97, and multiplexer 96.

It has also been found that period errors can be reduced by reducing the delay in the elements in the loop.

Figure 7:
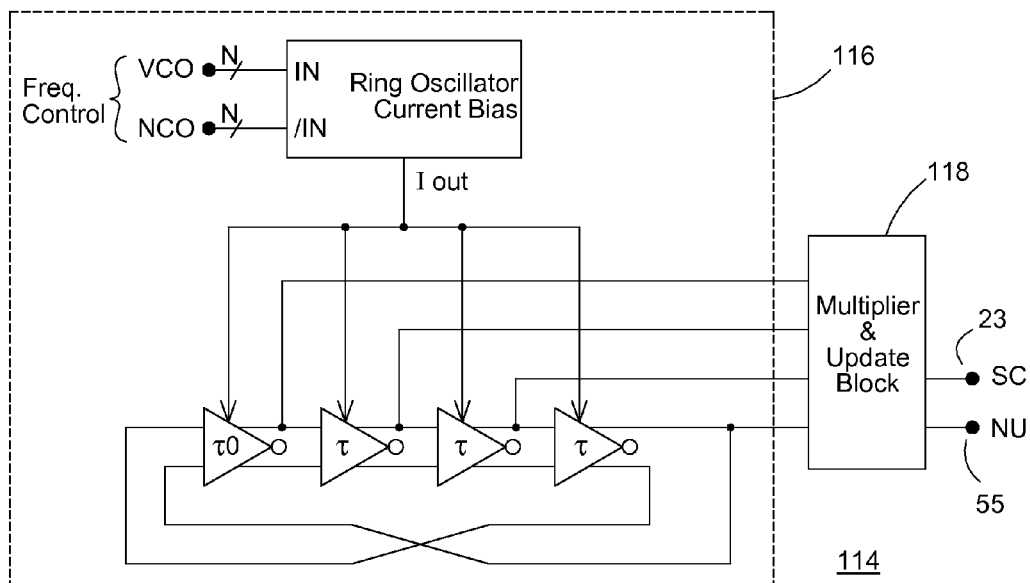
FIG. 7 schematically illustrates a portion of an example of a block diagram embodiment of a ring oscillator that is one example embodiment of an oscillator that may be used for the frequency control block of FIG. 3-FIG. 6 in accordance with the present invention.

FIG. 7 schematically illustrates a portion of an example of a block diagram embodiment of a system clock controller 114 that may be used as a portion of controller 46. Controller 114 includes a ring oscillator 116 that is one example embodiment of an oscillator that may be used for oscillator 48. Controller 114 also includes a multiplier and update block 118 that may be another portion of controller 46. This block diagram shows oscillator 116 based on four current starving delay cells, which after combination of each delay cell output and selecting therefrom facilitates forming clock multiplication up to four times and also illustrates a non-limiting example of a circuit for forming the update signal. In another embodiment, multiplier and update block 118 may be a portion of controller 46 and the other portions of the controller 114 may be a portion of oscillator 48 (FIG. 3). Those skilled in the art will also understand that there four phases are illustrated in FIG. 7 for simplicity of the explanation and that there is no limitation on the number of phases that may be used for forming the clock multiplication.

Figure 8:
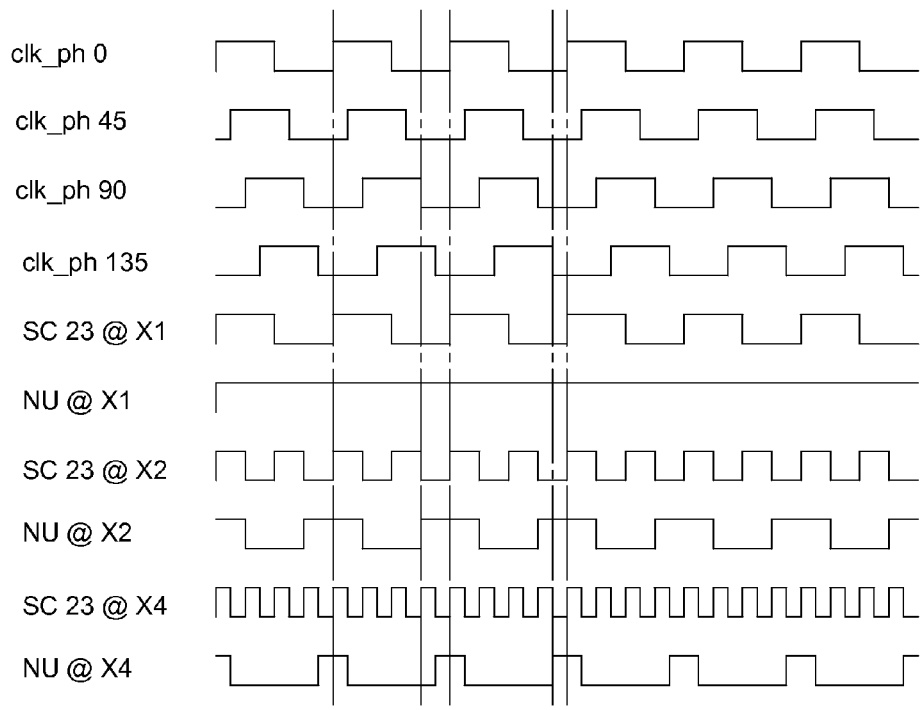
FIG. 8 is a graph having plots illustrating some signals formed by the oscillator of FIG. 7 in accordance with the present invention.

FIG. 8 is a graph having plots illustrating some signals formed by the oscillator of FIG. 7. The plots illustrate an oscillator output signal and an embodiment of the update signal for different cases of multiplication settings. Signals ck ph0-ck ph135 illustrate base clock signals at the base frequency. Note that the value of NU 55 changes in response to cycle reaching a count of zero and responsively to the next change in state of SC 23

Figure 9:
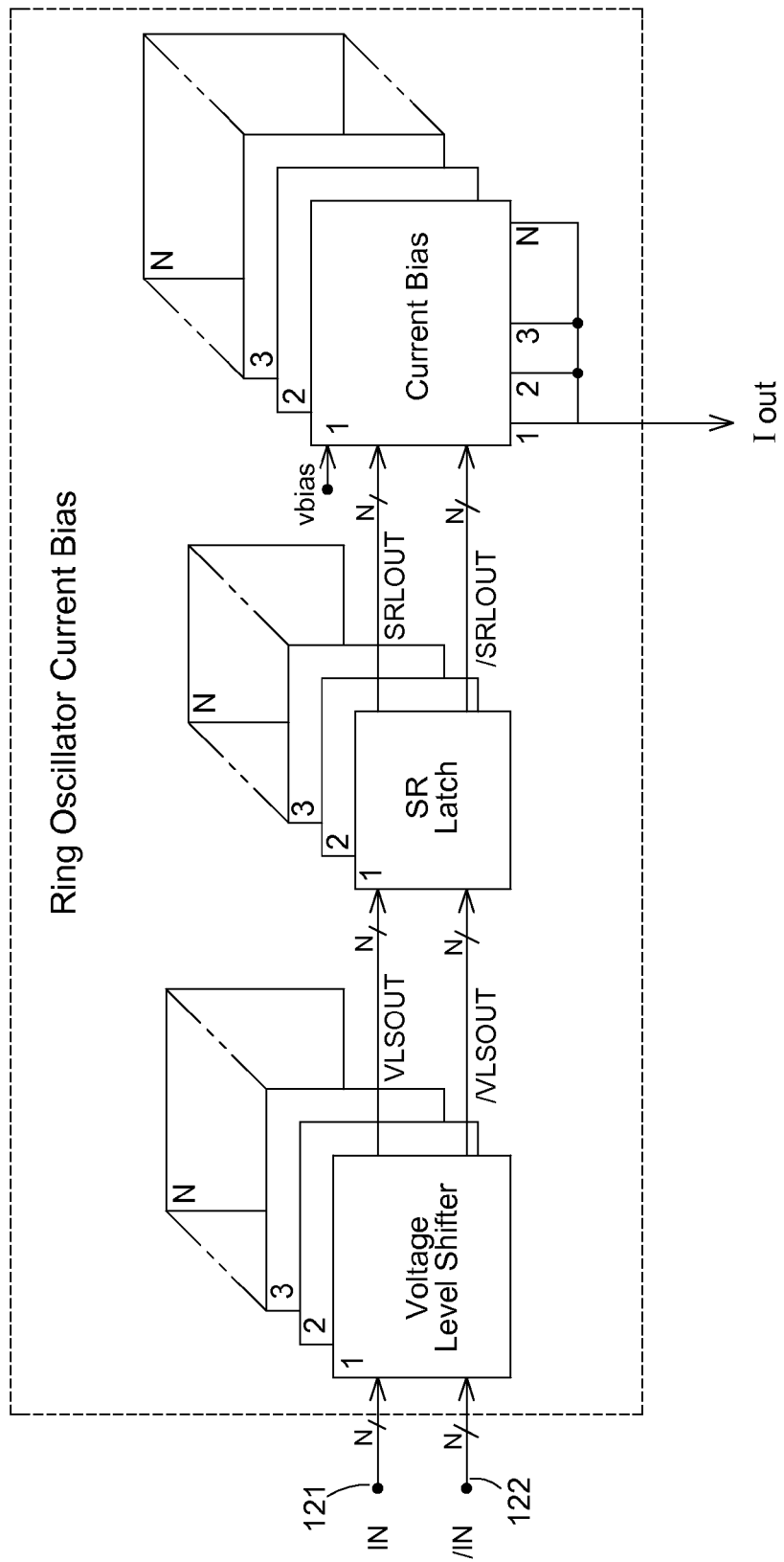
FIG. 9 schematically illustrates a portion of a non-limiting example of a block diagram embodiment of a bias circuit that may be used as a portion of the oscillator of FIG. 7 in accordance with the present invention.

FIG. 9 schematically illustrates a portion of a non-limiting example of a block diagram embodiment of a bias circuit that may be used as a portion of the oscillator of FIG. 7.

Figure 10:
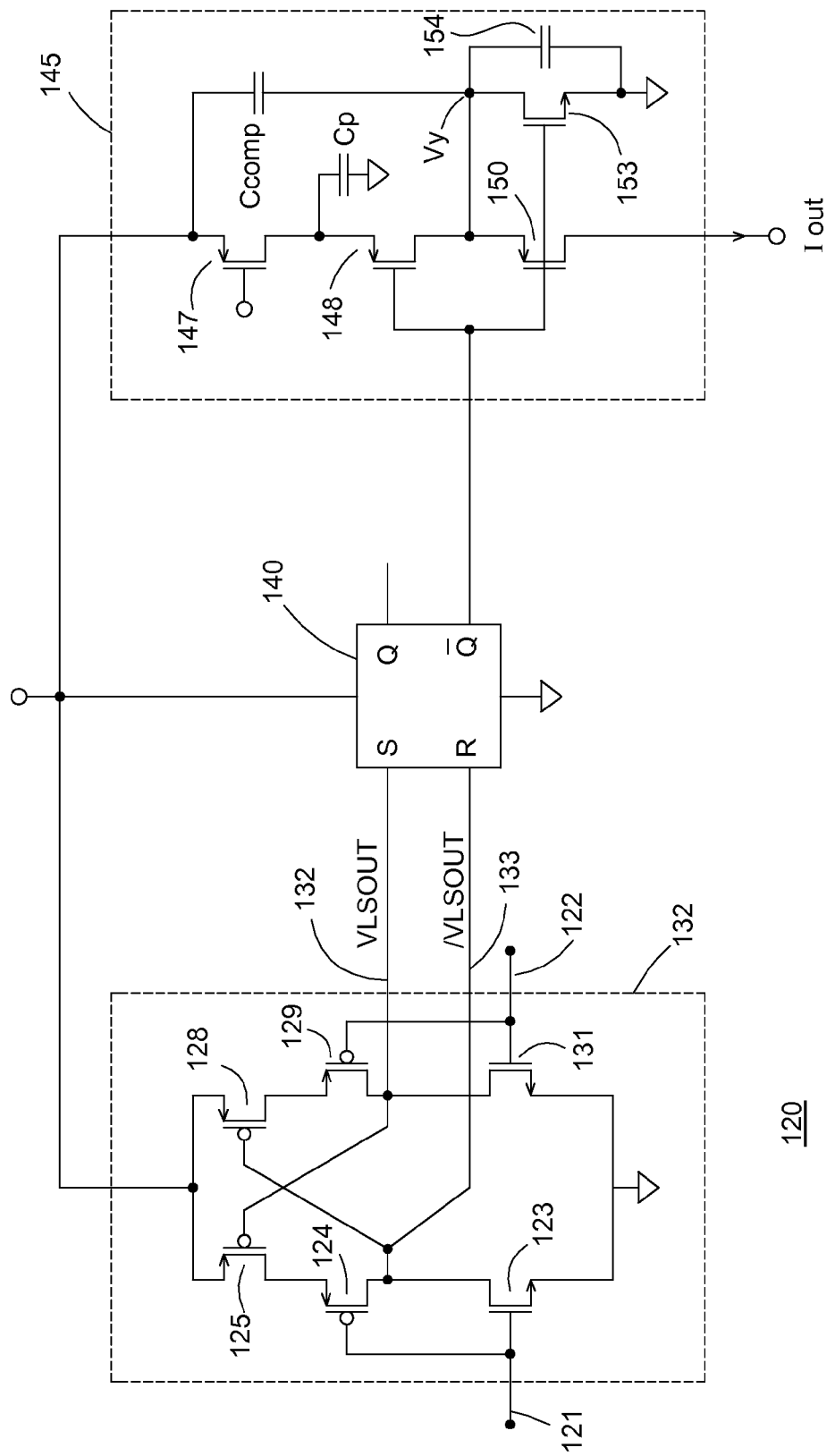
FIG. 10 schematically illustrates a portion of a non-limiting example of an embodiment of a bias circuit that may be used as a portion of the frequency control blocks of FIG. 3-FIG. 6 in accordance with the present invention.

FIG. 10 schematically illustrates a portion of a non-limiting example of an embodiment of a bias circuit 120 that is an alternate embodiment of the circuit of FIG. 9 and that alternately may be used as a portion of the oscillator of FIG. 7. Circuit 120 includes a level shifting and a delay unbalancing correction, between input-to-output signal rise-to-rise and fall-to-fall times, of a voltage level shifting all by means of a circuit 132, a Set-Reset latch 140, and a current bias circuit 145 that may be used to reduce the reaction time of the ring oscillator when a frequency configuration is changed. In some embodiments, circuit 120 may be a portion of oscillator 48.

Circuit 120 is configured to receive a bit of information as a differential voltage on an inputs 121 and 122, and provide outputs that have substantially equal times to transition from a low to a high and vice versa. Typically, the outputs of circuit 120 are connected to inputs of a storage device or element such as a flip-flop, or possibly a storage register. In some embodiments, circuit 132 and/or latch 140 may be a portion of store 47 (FIG. 5) or stores 92-94. The storage device may be used to store a value that will become the first or second relational values or may be used to set the base frequency. The substantially equal rise and fall times reduce the amount of time required to store the information within the storage device. Circuit 120 may be used as a portion of controller 46 such as to receive the FC 35 signals and control the base frequency of oscillator 48.

Figure 11:
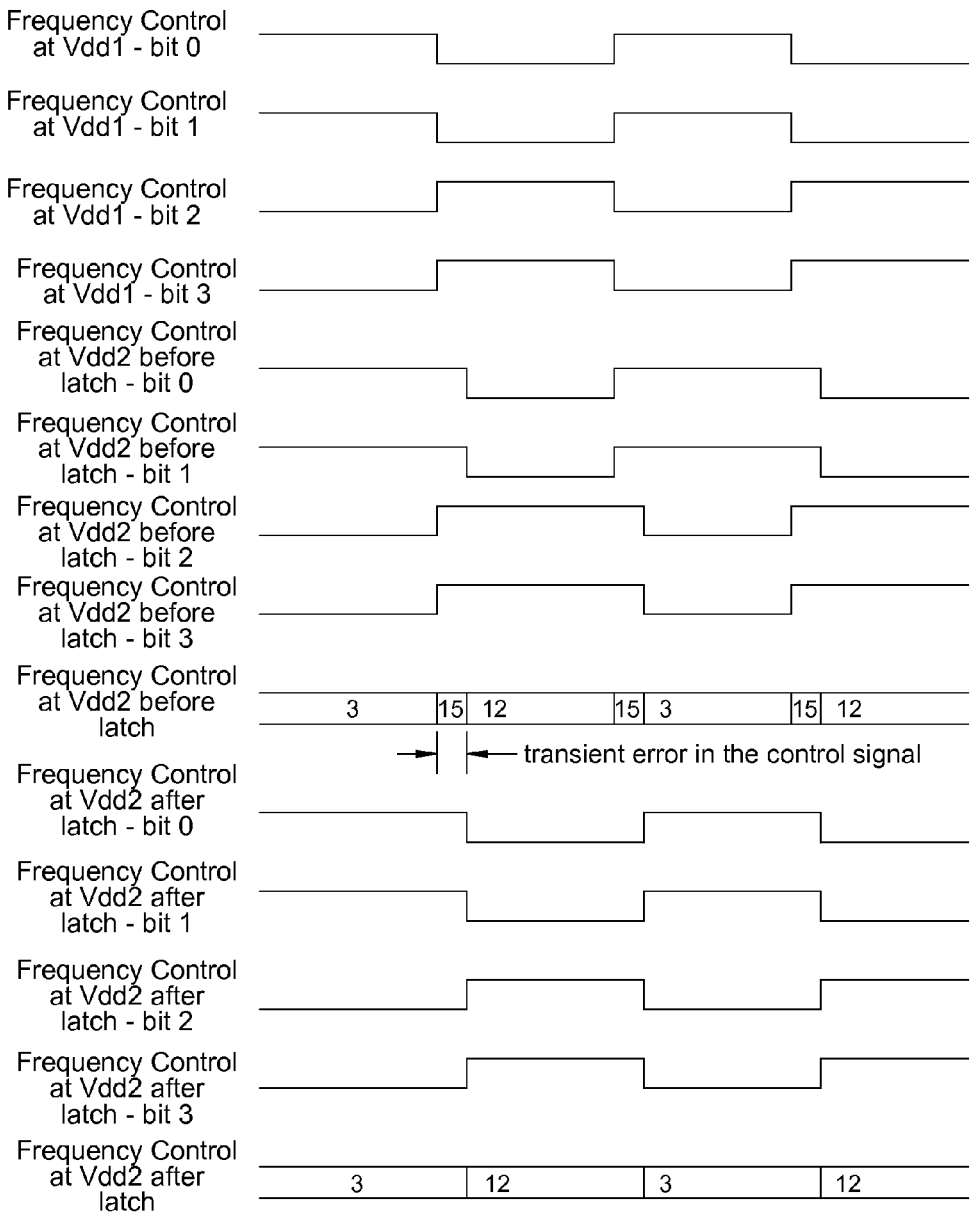
FIG. 11 is a graph having plots illustrating some signals formed by the oscillator of FIG. 7 in accordance with the present invention.

FIG. 11 is a graph of a timing diagram illustrating some signals formed by an embodiment of a circuit 120 that may be a portion of oscillator such as oscillator 48. This timing diagram illustrates a non-limiting example embodiment of voltage level shifting of the frequency control signals, before and after the delay correction.

The non-limiting example embodiment of the current bias cell may be used to reduce the reaction time of the ring oscillator when a frequency configuration is changed. In another embodiment, the non-limiting example embodiment of the latch 140 together with the current bias cell also may be used to reduce the reaction time of the ring oscillator when a frequency configuration is changed.

This description has references to FIG. 7-FIG. 11. The oscillator reaction time may be improved by using two mechanisms: a delay correction on the voltage level shifting of the frequency control signals and/or a modified current switching. The illustrated control signals of the oscillator may be voltage level shifted.

Some embodiments of architectures can result in a different delay between the input-to-output rise-to-rise signal and the input-to-output fall-to-fall signal. This difference can lead to transition errors on the frequency control signals of the oscillator, as shown in FIG. 11 such as in the region near the labeled as transient error in the control signal. Such errors can have a direct impact on the oscillator behavior, which may be translated on a more slow and incorrect reaction when a frequency change is requested.

On the other hand, circuit 120 uses the output (VLSOUT) and the complementary output (/VLSOUT) of the voltage level shifter as input signals to the SR Latch, those errors are minimized. In one example embodiment, one of the features that may assist in reducing the errors includes using the "no change state" characteristic of the SR latch. Since both branches of the voltage level shifter are equal, the "no change state" of the SR latch balances the input-to-output rise-to-rise signal and the input-to-output fall-to-fall signal by waiting for the slowest one. This leads to a correct and fast reaction of the oscillator, since it doesn't need to recover from a non-wanted code.

Figure 12:
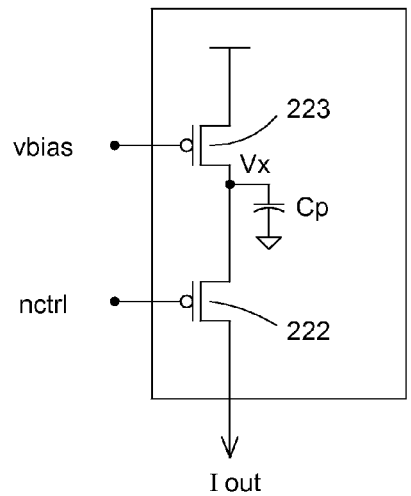
FIG. 12 schematically illustrates a portion of related art current bias circuits.
Figure 12:
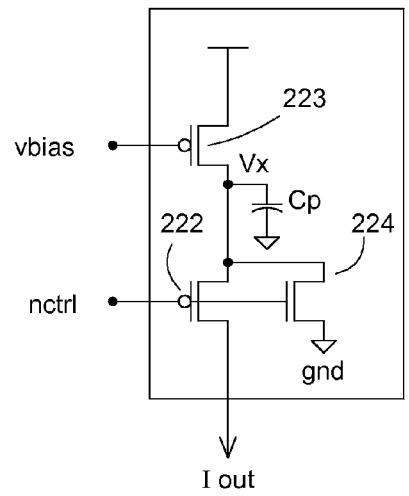

FIG. 12 schematically illustrates a portion of two related art current bias circuits 220 and 221. The current switching method of circuit 220 may exhibit charge sharing when the transistor 222 is activated/deactivated. Therefore, an oscillator may react to that unwanted charge before it stabilizes. The capacitor Cp represents a parasitic capacitance plus the gate-drain capacitance on node Vx.

The current switching method of circuit 221 may have unwanted current consumption. On this case all the current branches have current consumption independent if they are used by the delay cells or not.

Referring back to FIG. 11, circuit 145 or alternately circuit 140 together with circuit 145 minimizes these issues. The charge sharing is minimized between the bias current and the delay cells, when a current branch is activated/deactivated. When the current branch is deactivated, the transistors 148 and 150 are in off state, cutting the current flow, and transistor 153 is in on state doing a reset of the node Vy to form substantially the same initial conditions to all current branches independently of the previous configuration. When the current branch is activated, the transistors 148 and 150 turn to on state, enabling the current flow, and transistor 153 passes to off state. The discharge of Cp is absorbed by the capacitor Ccomp, avoiding a direct charge peak over the delay cells. The dimensioning of Ccomp is based on the Cp size, supply voltage and the desired voltage on node Iout. Those effects combined facilitate forming a smooth, more accurate and predictable reaction of the oscillator, such as oscillator 48 or the oscillator of FIG. 7) when a frequency change is requested.

In one non-limiting example embodiment, the output of the storage device may be used to control the frequency of oscillator 48. For example, the output of the storage device may be connected to a inputs 121 and 122 of circuit 120.

Figure 13:
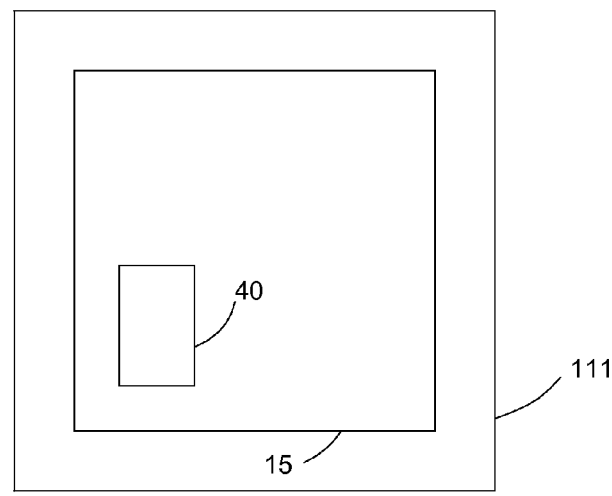
FIG. 13 illustrates an enlarged plan view of a semiconductor device that includes any of the frequency control blocks of FIG. 2, FIG. 3, FIG. 5, and FIG. 6 in accordance with the present invention.

FIG. 13 illustrates an enlarged plan view of a portion of an embodiment of a semiconductor device or integrated circuit 110 that is formed on a semiconductor die 111. System 10 or any of blocks 40, 70, and/or 90 may be formed on die 111. Die 111 may also include other circuits that are not shown in FIG. 14 for simplicity of the drawing. System 10 or any of blocks 40, 70, and/or 90 and device or integrated circuit 110 are formed on die 111 by semiconductor manufacturing techniques that are well known to those skilled in the art.

Those skilled in the art will understand that in one embodiment, an audio processing system may comprise: an audio receiving means to receive an audio signal and form a converted signal that is representative of the audio signal, the audio receiving means to operate from a first clock having a first frequency;

a signal processing means configured to operate from a system clock having a second frequency and configured to process the converted signal;

a clock control means configured to form the first clock from the system clock; and the clock control means configured to change the second frequency and not substantially change the first frequency.

In another embodiment, the system may include the clock control means configured to form the first clock as a fractional value of the system clock, and to change the second frequency and the fractional value synchronously with a state change of the system clock.

In another embodiment, the system may include the clock control means configured to change the second frequency and to change a relational value between the system clock and the first clock to maintain the first frequency substantially constant.

Another embodiment of the system may include the clock control means configured to form a base oscillator signal and to form the system clock as an integer multiple of the oscillator signal.

Those skilled in the art will understand that another embodiment of an audio processing system may comprise:

a processor (such as processor 18 for example) that operates from a system clock (such as clock SC 23 for example) and that processes an electrical signal, the system clock having a first frequency;

an analog-to-digital converter (for example processor 17) that operates from a second clock (such as MAC 24 for example), the analog-to-digital converter configured to receive a first electrical signal that is representative of an audio wave and configured to convert the first electrical signal to a digital signal, the second clock having a second frequency;

a frequency control block (for example block 21) having an oscillator that generates a base oscillator signal at a third frequency;

a multiplier (such as a multiplier example of block 27) of the frequency control block configured to receive the base oscillator signal and multiply the third frequency by a first relational value to form the system clock at the first frequency;

a divider (such as a multiplier example of controller 43) of the frequency control block configured to receive the system clock and divide the system clock by a second relational value to form the second clock at the second frequency; and the frequency control block configured to change the first relational value to change the first frequency to a fourth frequency and configured to change the second relational value to maintain the second frequency substantially Another embodiment of the audio processing system may include that the frequency control block is configured to form a next update signal (for example NU 55) synchronously to the system clock when a value of the multiplier reaches a first multiplier value.

In another embodiment the audio processing system may include that the frequency control block is configured to change the second relational value responsively to the next update signal.

The audio processing system may have another embodiment that includes a digital-to-analog converter that is configured to be controlled by the second clock and perform conversions at the second frequency.

Another embodiment of the audio processing system may include that the frequency control block is configured to change the first and second relational values responsively to the multiplier reaching the first relational value and the system clock changing state.

Yet another embodiment of the audio processing system may include that the frequency control block is configured to change the third frequency for at least one cycle responsively to changing the first frequency to the fourth frequency.

In another embodiment the audio processing system may include that the frequency control block is configured to increase the third frequency to a fifth frequency for at least one cycle in response to an increase in the third frequency and to subsequently decrease the fifth frequency to a sixth frequency that is less than the third frequency for at least one cycle of the base oscillator signal.

Those skilled in the art will also understand that another embodiment of an audio processing system may comprise: a processor (for example a processor 18) that operates from a system clock (such as SC 23 for example) and that processes electrical signals, the system clock having a first frequency;

a first conversion device (for example processor 17 or 19) that operates from a second clock (such as MAC 24 for example) having a second frequency the first conversion device configured to receive a signal that is representative of an audio signal and form a first signal that is representative of the audio signal;

a frequency control block (such as frequency control block 70 for example) having an oscillator (such as oscillator 48 for example) that generates a base oscillator signal at a third frequency;

the frequency control block having a first controller (for example controller 46) configured to form the system clock at the first frequency from the base oscillator signal;

the frequency control block having a second controller (such as controller 43 for example) that receives the system clock and forms the second clock at the second frequency from the system clock; and the frequency control block configured to change the first frequency of the system clock to a fourth frequency and form the second clock at substantially the second frequency.

In another embodiment, the audio processing system may also include one of a multiplier (such as a multiplier of controller 77 for example) that receives the base oscillator signal and multiplies the third frequency by a first relational value to form the system clock at the first frequency or a variable frequency oscillator that varies the third frequency in response to a frequency control value; and the second controller having a divider circuit (such as a divider of controller 43 for example) that receives the system clock and divides the system clock by a second relational value to form the second clock.

Another embodiment of the audio processing system may include that the frequency control block is configured to change the second relational value and one of the frequency control value or the first relational value responsively to a state of the multiplier becoming a first value.

Yet another embodiment of the audio processing system may include that the audio processing system wherein the frequency control block includes a plurality of frequency storage elements (such as stores 92-94 for example) configured to each store a frequency control value for varying the third frequency by different values.

In another embodiment, the audio processing system may also include a logic block that is configured to form an update signal to synchronize changes in the first and second relational values to the system clock.

Another embodiment of the audio processing system may include that the second controller is configured to form a load state signal responsively to a state of a divider of the second controller reaching a count of a first value.

Those skilled in the art will appreciate that an embodiment of a method of forming an audio processing system may comprise:

forming a first conversion device (such as the a conversion device of processor 17) to operate from a first clock (for example MAC 24) and form a first signal that is representative of an audio signal wherein the first clock has a first frequency;

configuring a processor (such as processor 18 for example) of the audio processing system to operate from a system clock (such as SC 23 for example) and process the first signal wherein the system clock has a second frequency; and configuring a frequency control block (such as one of blocks 40/70/90) of the audio processing system to form the first clock and the system clock and to substantially maintain the first frequency substantially constant for changes of the second frequency.

Another embodiment of the method may include configuring a first controller (such as one of controllers 46/77) to form a base clock at a base frequency and multiply the base frequency by a first relational value to form the system clock.

In another embodiment, the method may also include configuring a second controller (such as controller 43 for example) to form the first frequency of the first clock as a second relational value to the system clock wherein the second relational value is changed for a change in the first relational value.

Yet another embodiment of the method may include configuring a first controller (such as one of controllers 46/77) to form a base clock at a base frequency and change the base frequency to a third frequency while maintaining the first frequency substantially constant.

Another embodiment of the method may include changing a second relational value between the first clock and the system clock.

In another embodiment, the method may also include that the frequency control block includes a plurality of storage elements wherein each storage element stores a value representing a frequency for the base clock.

Another embodiment of the method may include configuring the frequency control block of the audio processing system to form the first clock and the system clock, and configuring the frequency control block to synchronize changes of the first and second frequencies to a change in state of the system clock.

Those skilled in the art will appreciate that an embodiment of a method of forming a voltage level shifter (such as a voltage level shifter of an audio processing system for example) may comprise;

forming the voltage level shifter having a first input (such as input 121 for example) couple to receive a first portion of a differential signal and a second input (such as input 122 for example) coupled to receive a second portion of the differential signal;

forming a first transistor (such as a transistor 123 for example) having a CE coupled to the first input, a first current carrying electrode coupled to a common return, and a second CEE;

forming a second transistor (such as a transistor 131 for example) having a CE coupled to the second input, a first current carrying electrode coupled to the common return, and a second CEE;

forming a third transistor (such as a transistor 124 for example) having a CE coupled to the first input, a first current carrying electrode coupled to the second CEE of the first transistor, and a second CEE;

forming a fourth transistor (such as a transistor 125 for example) having a first current carrying electrode coupled to the second CEE of the third transistor, a second CEE coupled to a voltage input, and a CE coupled to the second CEE of the second transistor and to a first output (such as output VLSOUT for example) of the voltage level shifter;

forming a fifth transistor (such as a transistor 129 for example) having a CE coupled to the second input, a first current carrying electrode coupled to the second CEE of the second transistor, and a second CEE; and forming a sixth transistor (such as a transistor 128 for example) having a first current carrying electrode coupled to the second CEE of the fifth transistor, a second CEE coupled to the voltage input, and a CE coupled to the second CEE of the first transistor and to a second output (such as output/VLSOUT for example) of the voltage level shifter.

Another embodiment of the method may include forming an SR latch (latch 140 for example) having a first input (set input for example) coupled to the first output of the voltage level shifter, a second input (reset input for example) coupled to the second output of the voltage level shifter, and an output.

Another embodiment of the method may include forming a seventh transistor (for example, transistor 150) having a CE coupled to the output of the SR latch, a first CEE coupled to a current output ((such as output Iout for example), and a second CEE coupled to a first node (such as node Vy for example);

forming an eight transistor (transistor 148 for example) having a CE coupled to the CE of the seventh transistor, a first CEE coupled to the first CEE of the seventh transistor, and a second Cee;

forming a ninth transistor (transistor 147 for example) having a CE coupled to receive a bias voltage, a first CEE coupled to the second CEE of the eight transistor, and a second CEE coupled to the voltage input;

forming a tenth transistor (transistor 153 for example) having a CE coupled to the Ce of the seventh transistor, a first CEE coupled to the common return, and a second CEE coupled to the first node;

coupling a first terminal of a first capacitor (capacitor 154 for example) to the first node and coupling a second terminal of the first capacitor to the common return; and coupling a first terminal of a second capacitor (capacitor Cp for example) to the first Cee of the ninth transistor and coupling a second terminal of the first capacitor to the common return.

In another embodiment the configuration of the Seventh through tenth transistors and the first and second capacitor form a current bias circuit that may be configured to form a bias current at the current output and wherein the CE of the seventh transistor is not coupled to the output of the SR latch but is coupled to receive a digital signal from another circuit wherein the digital signal has an asserted state and a negated state.

In view of all of the above, it is evident that a novel device and method is disclosed. Included, among other features, is forming a frequency control block to change a frequency of the system clock while keeping the frequency of the audio clock substantially constant. Also included is configuring the frequency control block to change the relationship between the system clock and the audio clock substantially simultaneously to changing the relationship between the system clock and another clock. Further included is configuring the frequency control block to change the relationship between the system clock and the audio clock responsively to a state of a system clock controller becoming sufficient to allow changing the relationship. Additionally included is configuring the frequency control block to change the relationship between the system clock and the audio clock substantially synchronously to an edge of the system clock. Each one of the above included elements assists in minimizing errors in the period of the audio clock thereby minimizing audio artifacts in the outgoing signal of the audio processing system.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. As will be appreciated by those skilled in the art, the example form of system 10 and blocks 40, 70, and 90 are used as vehicles to explain the operation method of changing the system clock and keeping the audio clock substantially constant and minimizing errors in the period of the audio clock. Those skilled in the art will appreciate that blocks 40, 70, and 90 may be configured with various other embodiments in addition to the embodiments explained herein as long as the frequency of the system clock is changed and the frequency of the audio clock remains substantially constant with minimized period errors. For example, controller 43 and/or 61 may be configured to include a multiplier or a divider or nay other circuitry that may be used to receive SC 23 and adjust the frequency of MAC 24 to maintain a substantially constant frequency for MAC 24 in response to changes in the frequency of SC 23. Controller 46 may also be configured to include a divider or multiplier that is used to form the frequency of SC 23 such as in response to the first relational value for example. In other embodiments, controller 43 and/or 61 may be configured to receive the base frequency and form respective MAC 24 and OC 25 to have a constant value for changes in the frequency of SC 23. Blocks 40, 70, and 90 may be configured with various other embodiments as long as the relationship between the system clock and the audio clock is changed substantially simultaneously with changing the frequency of the system clock. Additionally, blocks 40, 70, and 90 may be configured with still other various embodiments as long as the relationship between the system clock and the audio clock is synchronized with the system clock, such as with an edge of the system clock or/and synchronized with a state change of the system clock.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within The scope of the invention, and form different embodiments, as would be understood by those skilled in the art.

The invention claimed is:

1. An audio processing system comprising:
a processor that operates from a system clock and that processes an electrical signal, the system clock having a first frequency;
an analog-to-digital converter that operates from a second clock, the analog-to-digital converter configured to receive a first electrical signal that is representative of an audio wave and configured to convert the first electrical signal to a digital signal, the second clock having a second frequency;
a frequency control block having an oscillator that generates a base oscillator signal at a third frequency;
a multiplier of the frequency control block configured to receive the base oscillator signal and multiply the third frequency by a first relational value to form the system clock at the first frequency;
a divider of the frequency control block configured to receive the system clock and divide the system clock by a second relational value to form the second clock at the second frequency; and
the frequency control block configured to change the first relational value to change the first frequency to a fourth frequency and configured to change the second relational value to maintain the second frequency substantially constant.

2. The audio processing system of claim 1 wherein the frequency control block is configured to form a next update signal synchronously to the system clock when a value of the multiplier reaches a first multiplier value.

3. The audio processing system of claim 2 wherein the frequency control block is configured to change the second relational value responsively to the next update signal.

4. The audio processing system of claim 1 further including a digital-to-analog converter that is configured to be controlled by the second clock and perform conversions at the second frequency.

5. The audio processing system of claim 1 wherein the frequency control block is configured to change the first and second relational values responsively to the multiplier reaching the first relational value and the system clock changing state.

6. The audio processing system of claim 1 wherein the frequency control block is configured to change the third frequency for at least one cycle responsively to changing the first frequency to the fourth frequency.

7. The audio processing system of claim 6 the frequency control block is configured to increase the third frequency to a fifth frequency for at least one cycle in response to an increase in the third frequency and to subsequently decrease the fifth frequency to a sixth frequency that is less than the third frequency for at least one cycle of the base oscillator signal.

8. An audio processing system comprising:
a processor that operates from a system clock and that processes electrical signals, the system clock having a first frequency;
a first conversion device that operates from a second clock having a second frequency the first conversion device configured to receive a signal that is representative of an audio signal and form a first signal that is representative of the audio signal;
a frequency control block having an oscillator that generates a base oscillator signal at a third frequency;
the frequency control block having a first controller configured to form the system clock at the first frequency from the base oscillator signal;
the frequency control block having a second controller that receives the system clock and forms the second clock at the second frequency from the system clock; and
the frequency control block configured to change the first frequency of the system clock to a fourth frequency and form the second clock at substantially the second frequency.

9. The audio processing system of claim 8 wherein the first controller includes one of a multiplier that receives the base oscillator signal and multiplies the third frequency by a first relational value to form the system clock at the first frequency or a variable frequency oscillator that varies the third frequency in response to a frequency control value; and
the second controller having a divider circuit that receives the system clock and divides the system clock by a second relational value to form the second clock.

10. The audio processing system of claim 9 wherein the frequency control block is configured to change the second relational value and one of the frequency control value or the first relational value responsively to a state of the multiplier becoming a first value.

11. The audio processing system of claim 8 wherein the frequency control block includes a plurality of frequency storage elements configured to each store a frequency control value for varying the third frequency by different values.

12. The audio processing system of claim 8 wherein the frequency control block includes a logic block that is configured to form an update signal to synchronize changes in the first and second relational values to the system clock.

13. The audio processing system of claim 8 wherein the second controller is configured to form a load state signal responsively to a state of a divider of the second controller reaching a count of a first value.

14. A method of forming an audio processing system comprising:
forming a first conversion device to operate from a first clock and form a first signal that is representative of an audio signal wherein the first clock has a first frequency;
configuring a processor of the audio processing system to operate from a system clock and process the first signal wherein the system clock has a second frequency; and
configuring a frequency control block of the audio processing system to form the first clock and the system clock and to substantially maintain the first frequency substantially constant for changes of the second frequency.

15. The method of claim 14 wherein configuring the frequency control block includes configuring a first controller to form a base clock at a base frequency and multiply the base frequency by a first relational value to form the system clock.

16. The method of claim 15 further including configuring a second controller to form the first frequency of the first clock as a second relational value to the system clock wherein the second relational value is changed for a change in the first relational value.

17. The method of claim 14 further including configuring a first controller to form a base clock at a base frequency and change the base frequency to a third frequency while maintaining the first frequency substantially constant.

18. The method of claim 17 further including forming a voltage level shifter having a first input coupled to receive a first portion of a differential signal and a second input coupled to receive a second portion of the differential signal;

forming a first transistor having a CE coupled to the first input, a first current carrying electrode coupled to a common return, and a second CEE;

forming a second transistor having a CE coupled to the second input, a first current carrying electrode coupled to the common return, and a second CEE;

forming a third transistor having a CE coupled to the first input, a first current carrying electrode coupled to the second CEE of the first transistor, and a second CEE;

forming a fourth transistor having a first current carrying electrode coupled to the second CEE of the third transistor, a second CEE coupled to a voltage input, and a CE coupled to the second CEE of the second transistor and to a first output of the voltage level shifter;

forming a fifth transistor having a CE coupled to the second input, a first current carrying electrode coupled to the second CEE of the second transistor, and a second CEE;

forming a sixth transistor having a first current carrying electrode coupled to the second CEE of the fifth transistor, a second CEE coupled to the voltage input, and a CE coupled to the second CEE of the first transistor and to a second output of the voltage level shifter.

19. The method of claim 17 wherein the frequency control block include a plurality of storage elements wherein each storage element stores a value representing a frequency for the base clock.

20. The method of claim 14 wherein configuring the frequency control block of the audio processing system to form the first clock and the system clock includes configuring the frequency control block to synchronize changes of the first and second frequencies to a change in state of the system clock.

\* \* \* \* \*